(12) United States Patent
Motojima

(10) Patent No.: US 8,077,290 B2
(45) Date of Patent: Dec. 13, 2011

(54) EXPOSURE APPARATUS, AND DEVICE MANUFACTURING METHOD

(75) Inventor: Junichi Motojima, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 783 days.

(21) Appl. No.: 11/759,491

(22) Filed: Jun. 7, 2007

(65) Prior Publication Data

US 2007/0285641 A1 Dec. 13, 2007

(30) Foreign Application Priority Data

Jun. 9, 2006 (JP) ................. 2006-160622
May 29, 2007 (JP) ................. 2007-142653

(51) Int. Cl.
*G03B 27/58* (2006.01)
*G03B 27/42* (2006.01)

(52) U.S. Cl. .................... 355/72; 355/53
(58) Field of Classification Search .......... 355/72, 355/53, 55

See application file for complete search history.

(56) References Cited

U.S. PATENT DOCUMENTS 6,236,447 B1 * 5/2001 Yamada et al. ............... 355/53

FOREIGN PATENT DOCUMENTS

| EP | 1037117 | 9/2000 |
|---|---|---|
| JP | 04-124808 | 4/1992 |
| JP | 07-074088 | 3/1995 |
| JP | 11-195579 | 7/1999 |
| JP | 2000-323404 | 11/2000 |
| JP | 2003-007607 | 1/2003 |

* cited by examiner

*Primary Examiner* — Peter B Kim
(74) *Attorney, Agent, or Firm* — Rossi, Kimms & McDowell LLP

(57) ABSTRACT

An apparatus includes a stage configured to hold a substrate and to be moved, a measurement station including a measurement device configured to measure, with respect to each of a plurality of measurement points in a surface of the substrate held by the stage, a position of the surface, and an exposure station configured to expose the substrate to radiation while the stage is scanned, the stage being moved to the exposure station from the measurement station after the position of the surface is measured, and being scanned in the exposure station in accordance with the measured position of the surface, wherein the apparatus is configured to calculate a status concerning an error of a measurement value of the measurement device with respect to each of the plurality of measurement points based on outputs of the measurement device obtained with respect to the plurality of measurement points, and to set arrangement of the plurality of measurement points based on the calculated statuses.

18 Claims, 15 Drawing Sheets

EXPOSURE APPARATUS, AND DEVICE MANUFACTURING METHOD

BACKGROUND OF THE INVENTION

1. Field of the Invention

The present invention relates to an exposure apparatus for exposing a substrate to radiation such as light, and a device manufacturing method using the exposure apparatus.

2. Description of the Related Art

A conventional projection exposure apparatus transfers and projects a circuit pattern of a reticle (mask) onto a wafer through a projection optical system in manufacturing a fine semiconductor device, such as a semiconductor memory and a logic circuit, using the photolithography technology.

In order to improve the resolution and expand the exposure area, a recent mainstream projection exposure apparatus is a step-and-scan exposure apparatus (i.e., a scanner) that scans a reticle relative to a wafer, and exposes a reticle pattern onto each exposure area on the wafer.

The scanner that has one wafer stage measures a wafer's surface shape by a focus measurement sensor FS arranged ahead in the scan direction in exposing a predetermined area PA with slight-shaped exposure light EL, as shown in FIG. 12. The simultaneous measurement of the wafer's surface shape and exposure provides real-time and precise focus control. This focus control arranges the focus measurement sensor FS ahead of the exposure position (projection optical system) and vertically adjusts the wafer stage based on a measurement result of the focus measurement sensor FS, thereby focusing the wafer at an exposure position. The measurement position of the focus measurement sensor FS and the exposure position are fixed. Here, FIG. 12 is a schematic plane view showing a relationship between a focus measurement position and an exposure position on a wafer.

On the other hand, an exposure apparatus having plural wafer stages is proposed for improved productivity. See Japanese Patent Application No. 2000-323404. This exposure apparatus previously measures the wafer's surface shape, and reflects this measurement result on the exposure. In general, for improved processing efficiency, a driving amount in the Z direction during exposure is calculated or mapped based on the wafer's surface shape previously measured by the wafer stage, and the wafer is exposed on the other stage based on the driving amount.

However, the conventional exposure apparatus cannot precisely measure the wafer's surface shape, or provide precise focus control. This is because there is an area that causes an error in a measurement result (measurement error area) due to a (primary coat) circuit pattern formed on a wafer, which is a pattern previously formed on a substrate and under a photoresist coated thereon.

FIGS. 13A and 13B are illustrations in which a focus measurement result has an error due to the primary coat circuit pattern. For example, a focus measurement system that uses an obliquely incident optical system introduces the measurement light obliquely to the wafer's surface, and calculates a focus value using a position of the reflected light. This focus measurement system detects the reflected light intensity, and calculates a position of the reflected light by calculating a centroid position of a detected waveform. When the measurement light ML is irradiated onto a boundary between a high reflectance part HR and a low reflectance part LR, as shown in FIG. 13A, the reflected light intensity from the high reflectance part HR is higher than that from the low reflectance part LR. Thereby, the detected waveform deforms, as shown in FIG. 13B, from an ideal waveform IW to a waveform RW. As a result, a measurement result shifts to HD in a direction of the high reflectance part HR from an original centroid position GP, causing an error in a focus measurement value.

Such a measurement error area exists, for example, as a wiring pattern CP in a shot shown in FIG. 14. When a surface shape is determined from a precisely measured measurement point MP and a measurement point MP' that is measured with a measurement error, defocusing and chip failure occur. Here, FIG. 14 is a view for explaining a measurement error area in a shot.

Accordingly, the conventional exposure apparatus does not measure the measurement error area or use a measurement result in the measurement error area. More specifically, there are proposed a method that arranges many focus measurement sensors and selects a focus measurement sensor to be used, a method that shifts a measurement position through a shift of a focus measurement sensor or an optical system, and a method that removes an abnormal value from a measurement result.

The method that arranges many focus measurement sensors is problematic due to the increased cost and lack of arrangement space. The method that shifts the focus measurement sensor or optical system complicates an optical system. Moreover, the method that considers a measurement value exceeding a threshold to be abnormal, and removes or invalidates this measurement value has no measurement values in the measurement error value in the shot, if such a measurement error value to be invalid exists. As a result, the number of measurement points in the shot decreases, and the calculation precision of the wafer's surface shape deteriorates.

BRIEF SUMMARY OF THE INVENTION

The present invention is directed to a precise measurement of a surface shape of a substrate.

An apparatus according to one aspect of the present invention includes a stage configured to hold a substrate and to be moved, a measurement station including a measurement device configured to measure, with respect to each of a plurality of measurement points in a surface of the substrate held by the stage, a position of the surface, and an exposure station configured to expose the substrate to radiation while the stage is scanned, the stage being moved to the exposure station from the measurement station after the position of the surface is measured, and being scanned in the exposure station in accordance with the measured position of the surface, wherein the apparatus is configured to calculate a status concerning an error of a measurement value of the measurement device with respect to each of the plurality of measurement points based on outputs of the measurement device obtained with respect to the plurality of measurement points, and to set arrangement of the plurality of measurement points based on the calculated statuses.

Further features of the present invention will become apparent from the following description of exemplary embodiments with reference to the attached drawings.

DESCRIPTION OF THE EMBODIMENTS

Figure 1:
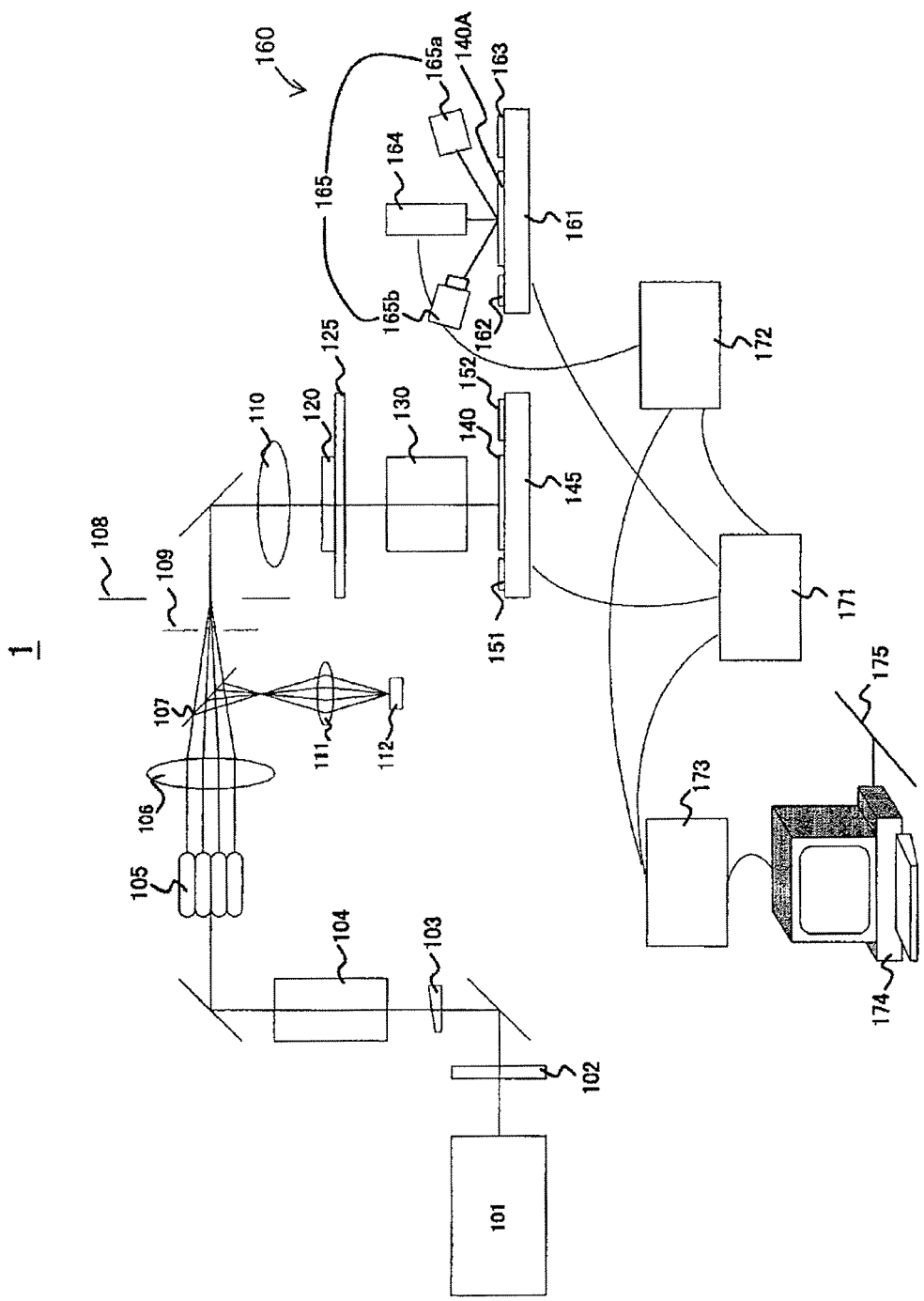
FIG. 1 is schematic block diagram showing a structure of an exposure apparatus according to one aspect of the present invention.

Referring now to the accompanying drawings, a description will be given of an exposure method and apparatus according to one aspect of the present invention. In each figure, the same reference numeral designates the same element, and a duplicate description thereof will be omitted. Here, FIG. 1 is a schematic block diagram showing a structure of an exposure apparatus 1 according to one aspect of the present invention.

The exposure apparatus 1 is a projection exposure apparatus that exposes a circuit pattern of a reticle onto a substrate (or a wafer in this embodiment). The exposure apparatus of this embodiment is a step-and-scan type projection exposure apparatus.

In FIG. 1, 101 is a light source that can use an excimer laser or an i-line lamp. 102 is an optical element having plural extinction ratios to extinct the light from the light source 101. The optical element 102 is an optical element represented by an ND filter having different transmittances.

103 is an optical unit that vibrates an angle of the coherent light, such as a laser beam, and removes the illuminance unevenness. 104 is a beam shaping optical system that shapes the light from the light source 101, and makes the light from the light source 101 incoherent.

105 is an optical integrator that forms a secondary light source. 106 is a condenser lens that illuminates a masking blade 108 using the light from the optical integrator 105 as the secondary light source.

107 is a half mirror that splits part of the light from the optical integrator 105. The masking blade (light shielding plate) 108 has four independently driving light shielding members, and maintains an optically conjugate relationship with the reticle 120 with respect to the imaging lens 110. An exposure slit 109 has two pairs of light shielding plates that shield the light in a direction orthogonal to the optical axis on the paper plane. The exposure slit 109 is arranged at a position that shifts in the optical axis direction from the masking blade 108, and the light intensity distribution by the exposure slit 109 has a trapezoid distribution. The imaging lens 110 images the light shielded by the masking blade 108, onto the reticle 120, and forms an image.

111 is a condenser lens that condenses the light split by the half mirror 107 onto a detector 112. The detector 112 is used to detect an exposure dose while the wafer 140 is exposed.

The reticle 120 has a circuit pattern to be transferred to the wafer 140, and is supported and driven by a reticle stage 125. The reticle 120 and the wafer 140 have an optically conjugate relationship. The reticle stage 125 supports the reticle 120.

The projection optical system or lens 130 projects a circuit pattern of the reticle 120 onto the wafer 140. The projection optical system 130 can use a dioptric, catadioptric, or catoptric system.

The wafer 140 is placed on a first wafer stage 145. A photoresist is applied to the surface of the wafer 140.

An exposure dose on the wafer 140 plane is detected by the detector 112, and controlled based on the detection result. An illuminance meter 151 is arranged on the first wafer stage 145, and can provide a desired exposure dose to the wafer 140 plane prior to exposure by previously investigating a relationship with the detector 112.

Various apparatus calibrations, such as a positional adjustment, between the reticle stage 125 and the first wafer stage 145 are executed using a fiducial mark 152 arranged on the first wafer stage 145. In the exposure apparatus 1, the light source 101 to the first wafer stage 145 constitutes an exposure station that actually exposes the wafer 140 placed on the first wafer stage 145.

The exposure apparatus 1 includes, in addition to the first wafer stage 145, a second wafer stage 161 in a measurement station 160. The second wafer stage 161 includes an illuminance meter 162, and a fiducial mark 163 for various calibrations, as well as the first wafer stage 145. The so-called exposure apparatus 1 has a twin stage system, and can improve the throughput by measuring the surface shape of the next wafer 140A while the wafer 140 is exposed. A detailed description of the measurement station 160 will be given later.

The first wafer stage 145 and the second wafer stage 161 are configured movable or replaceable with each other, and the second station can be moved to the exposure station while the wafer 140A having a measured surface shape is held on the second wafer stage 161. Of course, the present invention does not prevent the wafer 140A having a measured surface shape to be carried out of the second wafer stage 161, and to be placed on the first wafer stage 145.

The exposure apparatus 1 includes, in the measurement station 160, a measurement scope 164 that provides an alignment measurement, and a surface position detector 165 that provides a focus measurement. The focus measurement principle of this embodiment uses an obliquely incident optical system that is generally known in the exposure apparatus art. More specifically, it irradiates the light obliquely onto a measurement position of the wafer 140A from the LED 165*a*, and receives the reflected light from the wafer 140A at the detector 165*b*. The reflected light intensity distribution received by the detector 165*b* is converted into a waveform signal, which is used to calculate a surface position (focus) of the wafer 140A through an operation of the waveform signal.

The measurement scope 164 and the surface position detector 165 intend to measure a distortion amount and a relief shape of the wafer 140A. The measurement scope 164 and the surface position detector 165 measure a state, such as a distortion amount and a relief shape, of the wafer 140A placed on the second stage 161 while the wafer 140 placed on the first stage 145 is exposed via the projection optical system 130.

A stage controller 171 controls the first wafer stage 145 and the second wafer stage 161. A measurement controller 172 controls an action of the measurement station 160, or the measurement scope 164 and the surface position detector 165. In addition, the measurement controller 172 serves to store or record a measurement result by the measurement station 160. The stage controller 171 and the measurement controller 172 are connected to a main controller 173, and the main controller 173 integrally controls the exposure apparatus 1 including the measurement station 160. More specifically, the main controller 173 executes various correction functions of the exposure apparatus 1, and drives and controls each unit based on a user's command input via a computer 174, which will be described later, and a command downloaded via the network 175.

The computer 174 has an input device, such as a keyboard and a mouse, and defines an action of the exposure apparatus 1. The computer 174 controls an exposure condition and an exposure layout of the wafer 140, and the user selects a target condition from the controlled condition. The computer 174 is connected to a base network or the local area network 175 that exists in the environment of the exposure apparatus 1, and can download an operating condition of the exposure apparatus 1 via the network 175.

A detailed description will now be given of the measurement station 160. Basically, the measurement station 160 that measures focus and alignment has two measurement targets, i.e., a primary coat distortion amount (alignment) and the relief amount (focus) of the wafer 140A. The twin stage system exposes the wafers 140 and 140A based on a measurement result of the measurement station 160.

Figure 2:
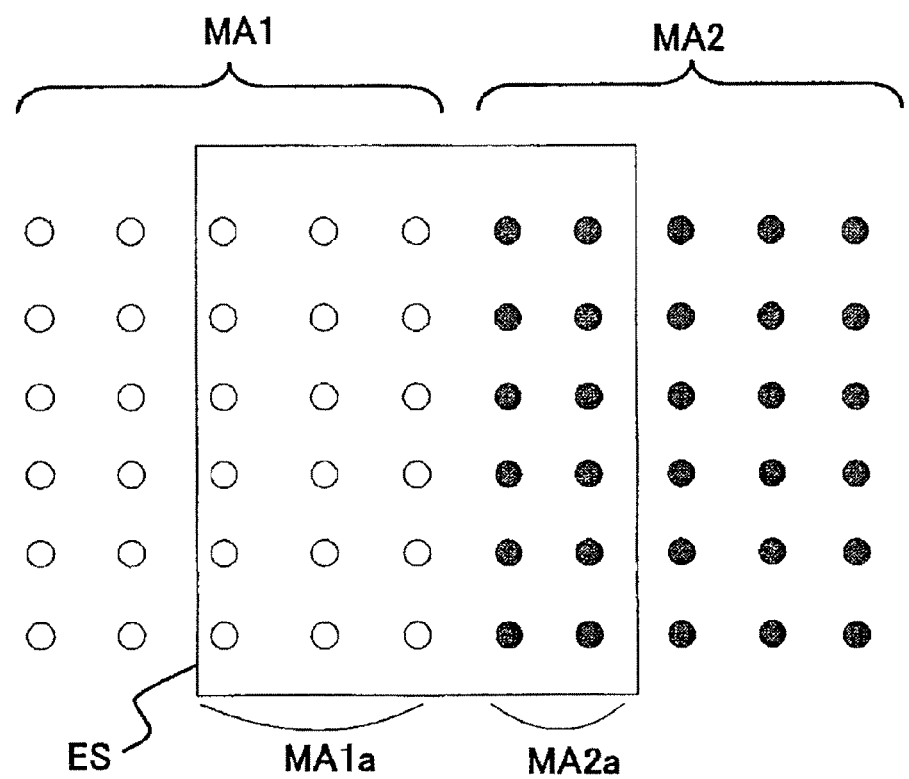
FIG. 2 is a view showing a relationship between a measurement point and en exposure shot in a measurement station in the exposure apparatus shown in FIG. 1.

For example, assume as shown in FIG. 2 a focus measurement result at the measurement points in areas MA1 and MA2. FIG. 2 shows a relationship between the measurement point in the measurement station 160 and the exposure shot ES. A wafer driving amount may be calculated using a measurement result in the exposure shot ES in exposing the exposure shot ES. The illustration shown in FIG. 2 uses a measurement result of the area MA1a in the area MA1 and a measurement result of the areas MA2a in the area MA2. Thus, the measurement of the stage position used to measure the wafer's surface shape is not limited to the exposure position of the stage used to expose the wafer. When the measurement error area is measured in measuring the wafer's surface shape, a focus measurement value has an error, and defocusing occurs if exposure uses the focus measurement value.

Accordingly, the exposure apparatus 1 previously measures the wafer's surface shape while shifting the second wafer stage 161 from a measurement result obtained during mapping so as to avoid a measurement of the measurement error area. In the exposure apparatus that previously measure the wafer's surface shape, this is derived from a feature that can determine the measurement error area based on the mapping information shown in FIG. 2.

The user may determine the measurement error area in accordance with a predetermined circuit pattern, or may use a measurement result that is available in measuring the wafer's surface shape. The exposure apparatus 1 stores a scattering of measurement results in the specific area such as a shot and/or waveform distortion as a measurement result of the wafer's surface shape in addition to the focus measurement value.

Figure 3:
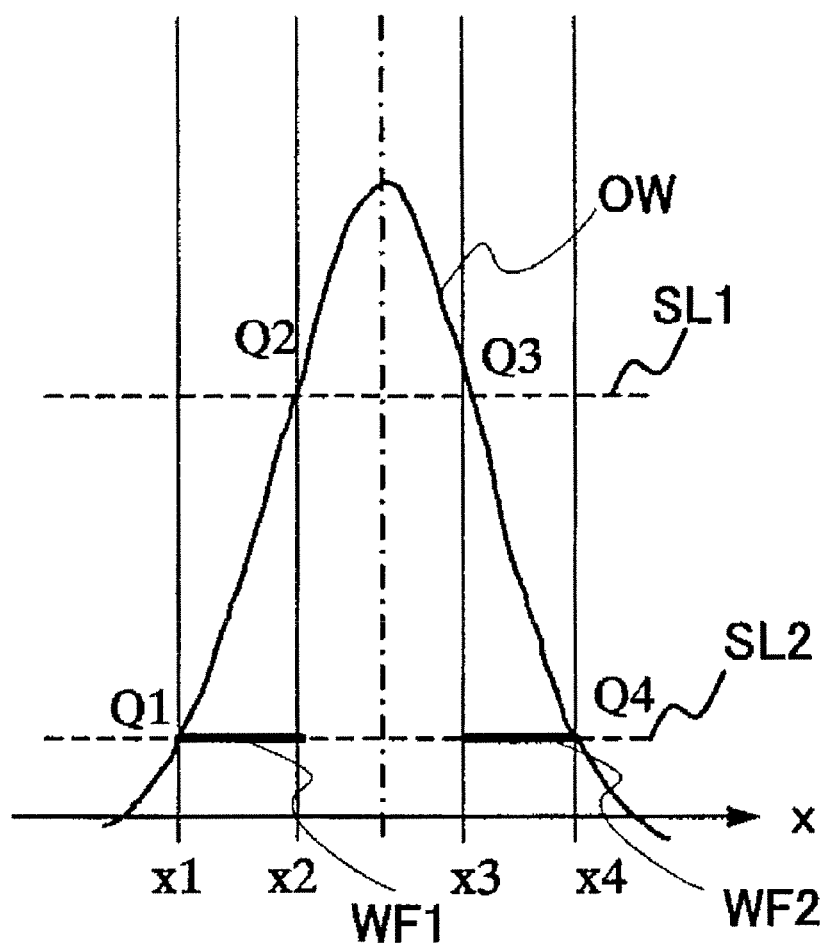
FIG. 3 is a view showing waveform symmetry as an illustrative measurement result stored in the exposure apparatus shown in FIG. 1.

The exposure apparatus 1 of this embodiment stores the waveform symmetry shown in FIG. 3 as one illustrative measurement result. FIG. 3 shows the waveform symmetry as one illustrative measurement result to be stored in the exposure apparatus 1. Assume OW is an output waveform of the focus measurement. Two slice levels SL1 and SL2 are set relative to the output waveform OW to calculate intersections Q1 to Q4. Four intersections Q1 to Q4 have x coordinates X1, X2, X3, and X4, and a gradient difference of the waveform OW showing WF1 and WF2 is recorded. More specifically, the waveform symmetry shown in Equation 1 below is recorded. When the waveform distorts under influence of the wafer surface process etc., the symmetry is destroyed and the measurement error area can be determined.

Symmetry=(Inc_L−Inc_R)/(Inc_L+Inc_R)

Inc_L=x2−x1, Inc_R=x4−x3         EQUATION 1

When the waveform symmetry is destroyed in Equation 1, a difference between Inc_L and Inc_R increases and the symmetry increases. On the other hand, when the waveform symmetry is small, the difference between Inc_L and Inc_R is small and the symmetry has a value close to zero. Thus, the measurement error area can be determined by comparing a Symmetry value with a threshold.

Figure 4:
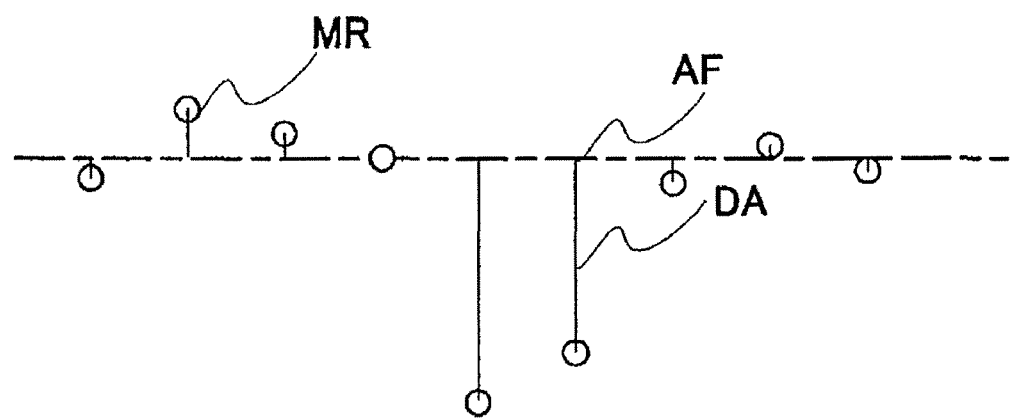
FIG. 4 is a view showing a focus measurement value distribution in a shot as an illustrative measurement result stored in the exposure apparatus shown in FIG. 1.

The exposure apparatus 1 may record a focus measurement value distribution in a shot shown in FIG. 4 as one illustrative measurement result. FIG. 4 shows the focus measurement value distribution as one illustrative measurement result recorded in the exposure apparatus 1. The exposure apparatus 1 calculates and records a difference value DA between a measurement result MR at each measurement point and an average focus value AF in the shot. When the difference value DA from the average focus value AF in the shot is large than other measurement points, it is conceivable that the focus detection error occurs. Hence, the measurement error area can be determined by comparing the difference value DA with the threshold.

While this embodiment uses the waveform symmetry and the difference value from the average focus value in the shot for the illustrative measurement result, another index may be used as long as it indicates a waveform state, such as a pattern recognition result through template matching etc. In addition, a determination of the measurement error area through a threshold process may use as a measurement result the waveform symmetry, an absolute focus value, the waveform symmetry in the specific area, and a relative value represented by a separation amount from an average focus value. These measurement results are statistically processed for each shot, wafer, and lot, and recorded in the exposure apparatus 1.

When there is a measurement error area, the exposure apparatus 1 shifts the second wafer stage 161 (wafer 140A), and maps so that the measurement error area is not measured. A user can arbitrarily set a shifting direction and amount of the second wafer stage 161 via the computer 174.

Figure 5A:
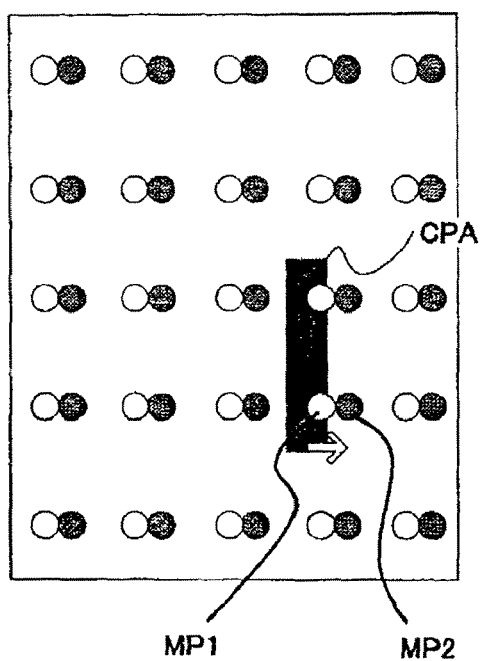
FIGS. 5A-5C are views for explaining a shift of a second wafer stage (or wafer) in the exposure apparatus shown in FIG. 1.
Figure 5B:
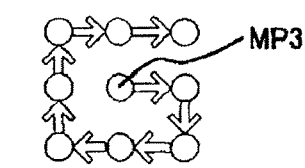
Figure 5C:
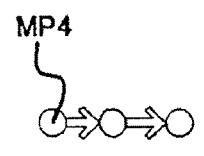

FIGS. 5A to 5C are views for explaining a shift of the second wafer stage 161 (wafer 140A). FIG. 5A shows an illustration in which a circuit pattern area CPA that causes a measurement error is previously known. Referring to FIG. 5A, the second wafer stage 161 (wafer 140A) is shifted so that the pre-shift measurement position MP1 can move to the measurement position MP2. In this case, the shift direction and the shift amount of the second wafer stage 161 (wafer 140A) are determined so that the least shift amount can make the circuit patter pattern area CPA not to be measured.

FIGS. 5B and 5C show illustrations when the measurement error area is detected based on a measurement result. In FIG. 5B, the stage 161 is shifted counterclockwise around the measurement position MP3 as the pre-shift initial position. In addition, in FIG. 5C, the stage 161 is sequentially shifted in the same direction from the measurement position MP4 as the pre-shift initial position. When the measurement position MP4 excessively shifts in the same direction, the measurement position MP4 moves beyond the shot, and the number of measurement points decreases. Thus, a shift amount preferably falls within a shift range that does not expel the measurement position MP4 outside the shot.

Figure 6:
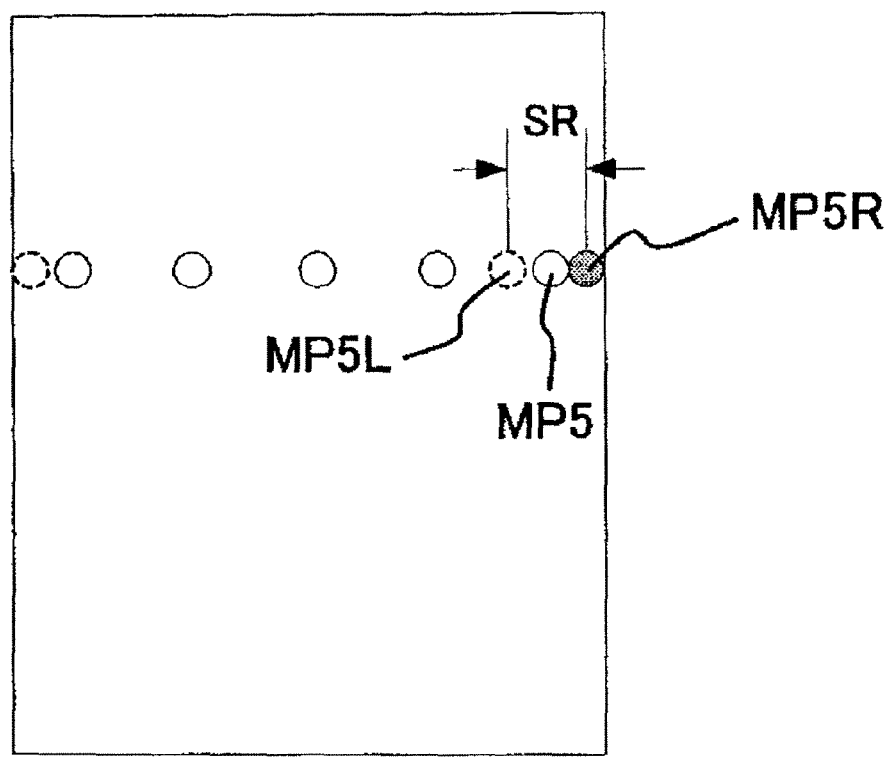
FIG. 6 is a view for explaining a shift of the second wafer stage (or wafer) in the exposure apparatus shown in FIG. 1.

For example, for the measurement MP5 shown in FIG. 6, MP5L is a maximum shift amount in the left side direction and MP5R is a maximum shift amount in the right side direction. A shift range is determined by SR. When the shift range exceeds SR, the shift amount that minimizes the measurement error area is selected. Here, FIG. 6 is a view for explaining a shift of the second wafer stage 161 (wafer 140A).

Since setting of the shift amount and direction of the second wafer stage 161 (wafer 140A) are similar for a wafer of the same process, the shift amount is calculated according to the information set for several initially processed wafers (for instance FIGS. 5B and 5C). In the exposure of the same process, the measurement error area distribution does not change. Therefore, in sequentially shifting the measurement position, the size of the measurement error area and an evaluation value are stored for each wafer, and the optimal shift amount that minimizes the measurement error area may be calculated. In pursuing the precision, a measurement result of an exposure pattern is obtained through a test wafer in advance to the exposure and the shift amount may be determined. Thereby, focus can be measured with an optimal shift amount from the beginning.

Figure 7:
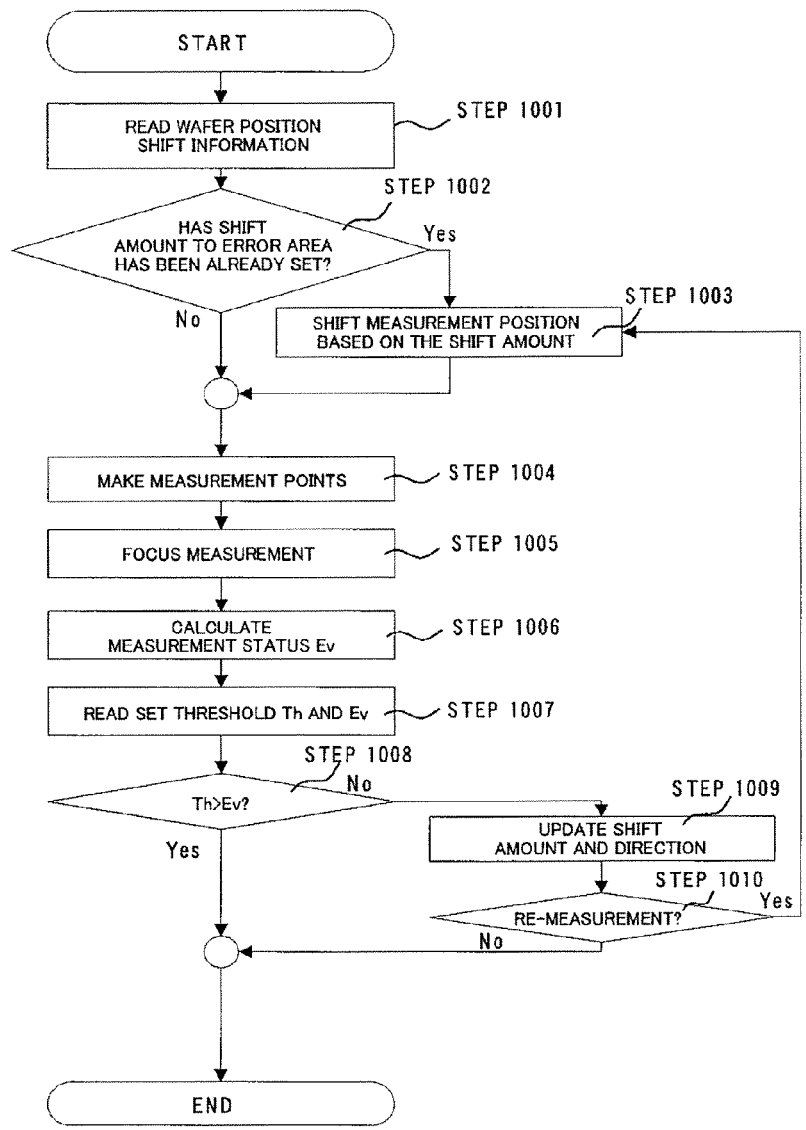
FIG. 7 is a flowchart for explaining an exposure method according to one aspect of the present invention.

Referring now to FIG. 7, a description will be given of an exposure method using the exposure apparatus 1, in particular, a measurement of the wafer's surface shape (mapping). FIG. 7 is a flowchart for explaining an exposure method according to one aspect of the present invention.

Initially, the wafer's positional shift information of the circuit pattern to be exposed by the exposure apparatus 1 is read (step 1001). Next, it is determined whether a wafer's shift amount relative to a measurement error area (or a measurement-position shift amount) is set (step 1002).

When the wafer's shift amount relative to the measurement error area is set, the wafer's measurement position is shifted based on the shift amount (step 1003), and the measurement points on the wafer are produced (step 1004). On the other hand, when the wafer's shift amount relative to the measurement error area is not set, the measurement points on the wafer are produced as they are (step 1004).

After the measurement points are produced on the wafer, focus is measured at positions of the measurement points produced by the step 1004 (step 1005). In addition, a measurement status Ev, such as the above waveform symmetry, is calculated with the focus measurement (step 1006), and this measurement status Ev is recorded. The measurement status Ev is statistically processed (such as averaged) and recorded for each shot, wafer, and lot.

After the focus measurement and the calculation of the measurement status Ev end, a threshold Th set by a user via the computer 174 and the measurement status Ev used to determine the measurement error area are read out (step 1007). Then, the measurement status Ev and the threshold Th are compared with each other (step 1008), and the measurement error area is calculated.

When the step 1008 determines that there is a measurement error area (when the measurement status Ev is greater than the threshold Th in this embodiment), the shift amount and direction of the second wafer stage 161 (wafer 140A) are updated (step 1009). The shift amount and direction of the second wafer stage 161 contain a shift amount that can be arbitrarily set by the user via the computer 174, a globally settable shift direction, and a shifting order that is a free combination between them, and it is updated with circuit pattern information and the number of measurement points in the shot after second wafer stage 161 is shifted.

When the step 1008 determines that there is a measurement error area (when the measurement status Ev is greater than the threshold Th in this embodiment), the shift amount and direction of the second wafer stage 161 (wafer 140A) are updated (step 1009). The shift amount and direction of the second wafer stage 161 contain a shift amount that can be arbitrarily set by the user via the computer 174, a globally settable shift direction, and a shifting order that is a free combination between them, and it is updated with circuit pattern information and the number of measurement points in the shot after second wafer stage 161 are shifted.

After the shift amount and direction of the second wafer stage 161 (wafer 140A) are updated, it is determined whether the wafer's surface shape can be measured again (step 1010). In measuring again the wafer's surface shape, the wafer's surface shape is measured based on the shift amount and direction updated by the step 1009 and the procedure returns to the step 1003. In addition, when the wafer's surface shape is not measured again, mapping ends.

When a shift amount used to measure the second wafer stage 161 is calculated before lotting, highly precise exposure is available without defects, but may be sequentially calculated during exposure. In measuring the shift amount in advance to the exposure, and in performing exposure while pursuing the precision, the step 1010 measures again the wafer's surface shape.

In exposing of the specific process, the circuit pattern is often previously known. In this case, for a previously known pattern, the second wafer stage 161 (wafer 140A) may be shifted so as to measure a target position to be focused or having a strict focus margin. Thereby, the wafer's surface position having a strict focus margin can be precisely accorded with a focus position of the projection optical system 130. Moreover, the second wafer stage 161 (wafer 140A) may be shifted so as to previously expose a test wafer etc. to specify a position having a strict focus margin, and to measure the surface shape at that position.

Figure 8:
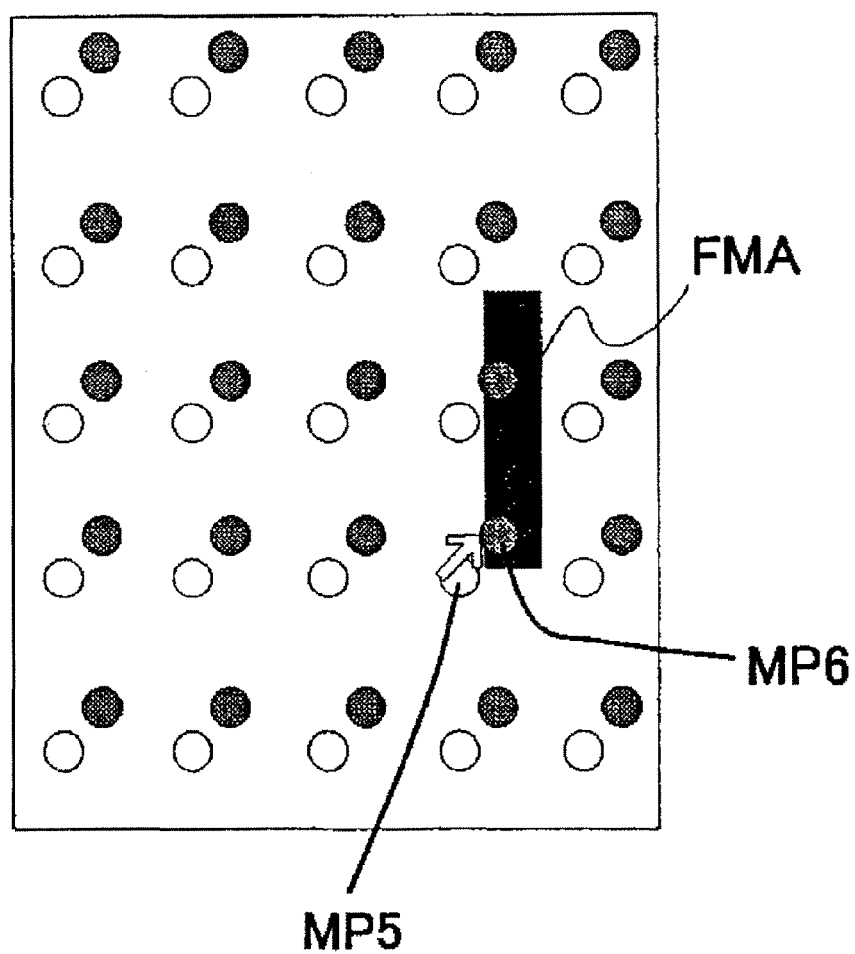
FIG. 8 is a view for explaining a shift of a second wafer stage (or wafer) in the exposure apparatus shown in FIG. 1.

FIG. 8 is a view for explaining a shift of the second wafer stage 161 (wafer 140A) with a known area FMA having a strict focus margin. Referring to FIG. 8, the second wafer stage 161 (wafer 140A) is shifted so that a pre-shift measurement position MP5 moves to a position of a measurement position MP6 (or so that a measurement position moves to the area FMA). In this case, the shift direction and amount of the second wafer stage 161 (wafer 140A) is determined so that the area FMA can be measured with the least shift amount.

Figure 9:
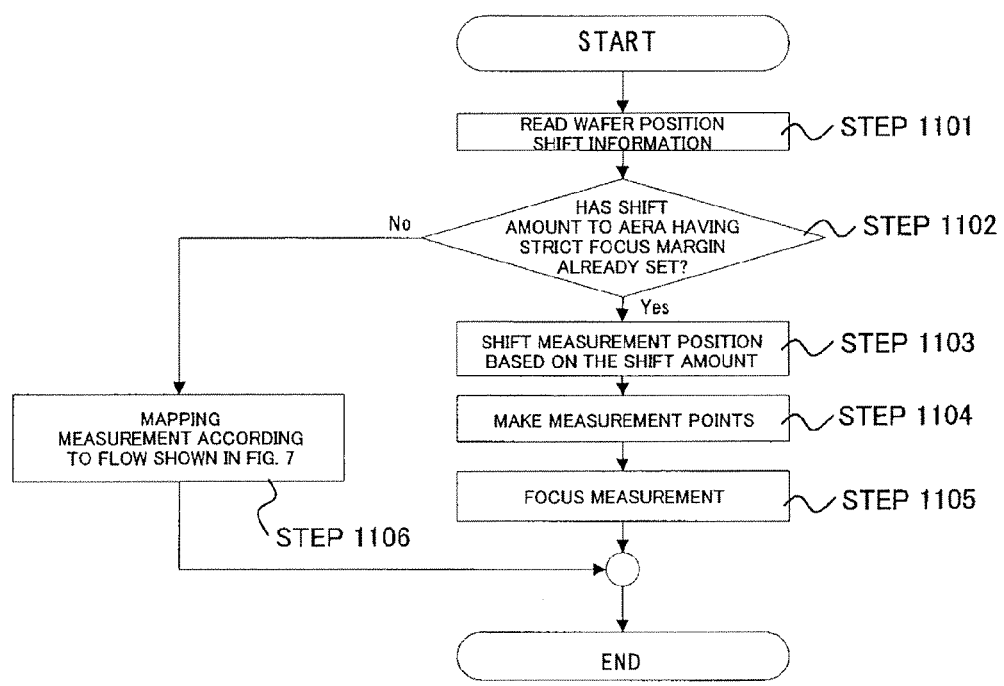
FIG. 9 is a flowchart for explaining an exposure method according to one aspect of the present invention.

Referring now to FIG. 9, a description will be given of an exposure method using the exposure apparatus 1, in particular, a measurement of the wafer's surface shape (mapping) at a position that needs most precise focusing. A description will now be given of a position having a strict margin as an example of the position that needs most precise focusing. FIG. 9 is a flowchart for explaining an exposure method according to one aspect of the present invention.

Initially, the wafer's positional shift information of the circuit pattern to be exposed by the exposure apparatus 1 is read (step 1101). Next, it is determined according to the circuit pattern whether the wafer's shift amount or the shift amount of the measurement position relative to the area having the strict focus margin is set (step 1002).

When the wafer's shift amount relative to the area having a strict focus margin is set, the wafer's measurement position is shifted based on the shift amount (step 1103), and the measurement points are produced on the wafer (step 1104). Next follows a focus measurement at the positions of the measurement points produced by the step 1104 (step 1105).

On the other hand, when the wafer's shift amount relative to the area having a strict focus margin is not set, the mapping measurement of the wafer is performed according to the flow shown in FIG. 7 (step 1106).

Figure 15:
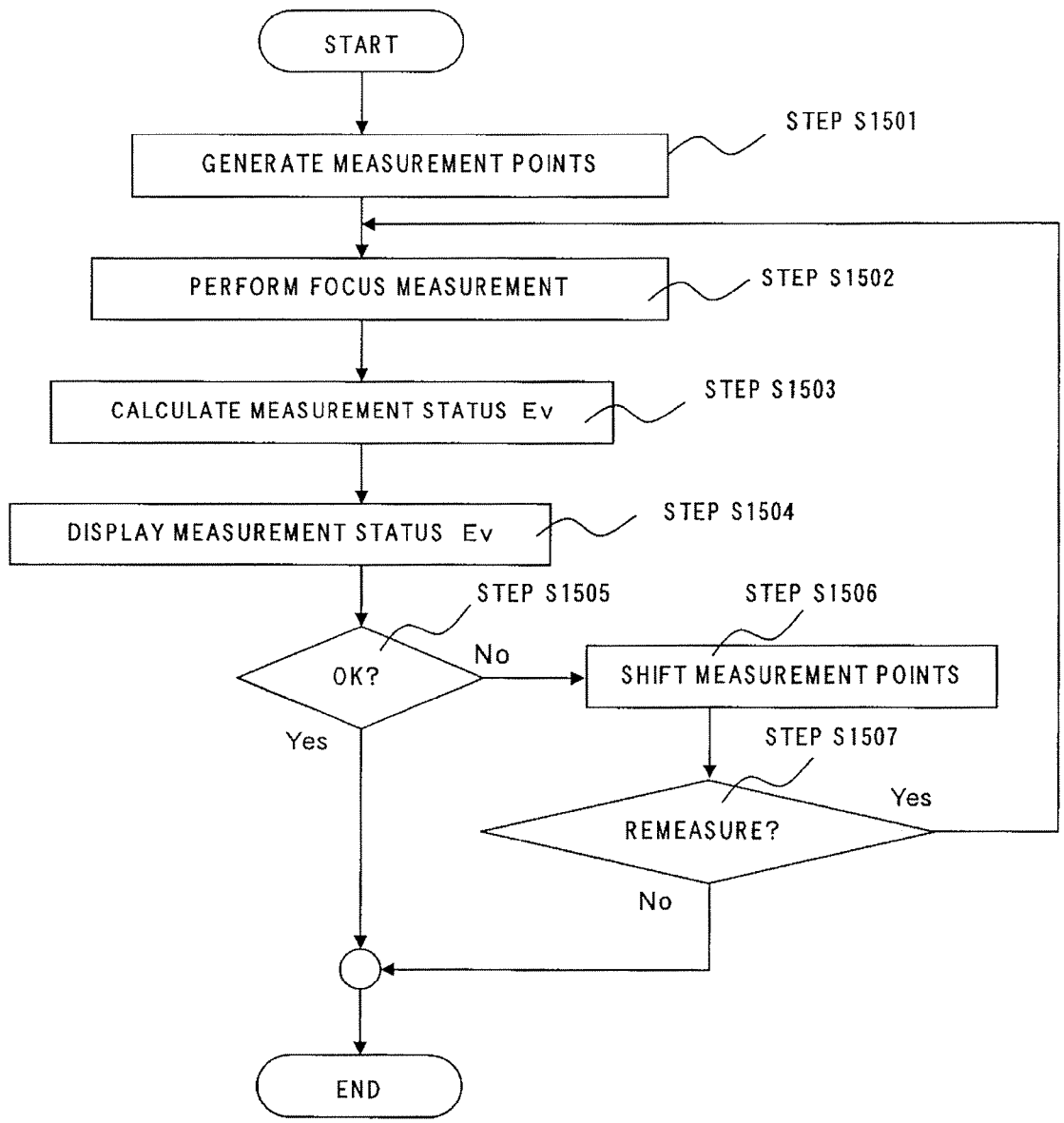
FIG. 15 is a flow chart for explaining an exposure method according to one aspect of the present invention.

Referring now to FIG. 15, a description will be given of a measurement (mapping) of a wafer's surface shape according to another embodiment. In the previous embodiment using the flowchart shown in FIG. 7, the exposure apparatus 1 automatically determines a measurement point for the wafer's surface shape. However, this embodiment provides a user with a measurement status at each measurement point, and allows a user to shift a measurement point and/or to set a final measurement point. FIG. 15 is a flowchart for explaining an exposure apparatus or an exposure method according to another aspect of the present invention.

Initially, the exposure apparatus 1 automatically generates a measurement point arrangement in a shot based on the wafer's shot layout information (step S1501).

After the measurement points on the wafer are generated, the focus measurement is performed at each measurement point generated at the step S1501 (step S1502). After the focus measurement ends, the measurement status Ev, such as the above waveform symmetry and/or a deviation at each measurement point, is calculated and stored (step S1503). The measurement status Ev may undergo a statistic process, such as averaging over plural predetermined shots.

After the measurement status Ev is calculated, the user is provided with (or views) the measurement statues Ev through a user interface, such as a computer or an input/output part 174 (step S1504). As in the previous embodiment, the measurement status Ev may be compared with the threshold Th, and the comparison result may be provided to or displayed for the user via the user interface 174. The comparison result is included in a concept of the measurement status, and the measurement status may be simply referred to as a status.

The next step S1505 determines in accordance with the user's input through the user interface 174 whether the current measurement point arrangement is sufficient (adequate). When it is determined sufficient, the exposure apparatus 1 ends mapping, and calculates a driving amount of a wafer (or a wafer stage 161) used for exposure based on the measured wafer's surface shape.

On the other hand, when the step S1505 determines that the current measurement point arrangement is insufficient, the exposure apparatus 1 shifts the measurement point arrangement in the shot (step S1506). The exposure apparatus 1 may automatically set the shift amount and direction in accordance with the preset information or the user may set them via the user interface 174 on a case-by-case basis, or any proper method may be adopted. The exposure apparatus 1 may automatically set the shift amount and direction using the method according to the previous embodiment.

When the step S1506 renews the measurement point arrangement in the shot, the exposure apparatus 1 determines in accordance with the user's input (instruction) through the user interface 174 whether the wafer's surface shape is to be remeasured with respect to the renewed measurement point arrangement (step S1507). When the exposure apparatus 1 determines that the wafer's surface shape is to be remeasured, the procedure returns to the step S1502 so as to measure the wafer's surface shape based on the measurement point arrangement renewed by the step S1506. When the exposure apparatus 1 determines that the wafer's surface shape is not to be remeasured, the exposure apparatus 1 ends mapping. In ending mapping, the just previously measured wafer's surface shape may be selected or one of the previously measured wafer's surface shapes may be selected automatically based on the stored measurement status Ev or in accordance with the user's input (instruction) through the user interface 174. Alternatively, the procedure may be terminated with an error indicating that the wafer's surface shape cannot be properly measured.

Thus, the mapping measurement of the wafer (exposure method) according to this embodiment can calculate the driving amount of the wafer (or wafer stage) used to accord the wafer's surface with a focus position of the projection optical system during exposure from the measurement result of the position that causes no focusing error. In addition, the mapping measurement of the wafer according to this embodiment does not reduce the number of measurement points for the focus measurement, and can calculate the wafer's driving amount precisely. Therefore, the exposure apparatus 1 can provide precise focus control, and realize an excellent exposure characteristic.

In exposure, the light is emitted from the light source 101 illuminates reticle 120 via the illumination optical system including the optical element 101 to the imaging lens 110. The light that has passed the reticle 120 and reflects the reticle pattern is imaged onto the wafer 140 by the projection optical system 130. In that case, the exposure apparatus 1 can precisely accord the focus position of the projection optical system 130 with the surface position of the wafer 140 through the precise focus control, as discussed above. Therefore, the exposure apparatus 1 can provide higher quality devices, such as semiconductor devices and LCD devices than ever.

Figure 10:
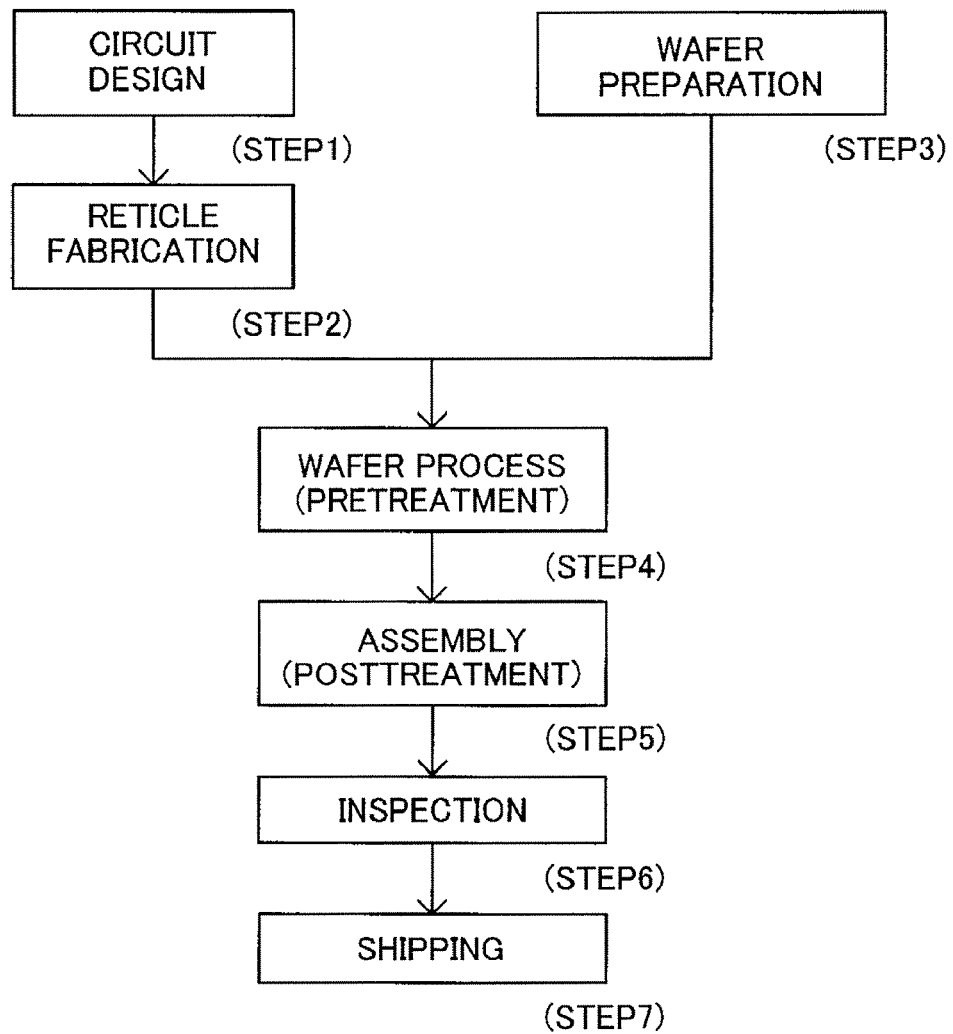
FIG. 10 is a flowchart for explaining a manufacture of a device.
Figure 11:
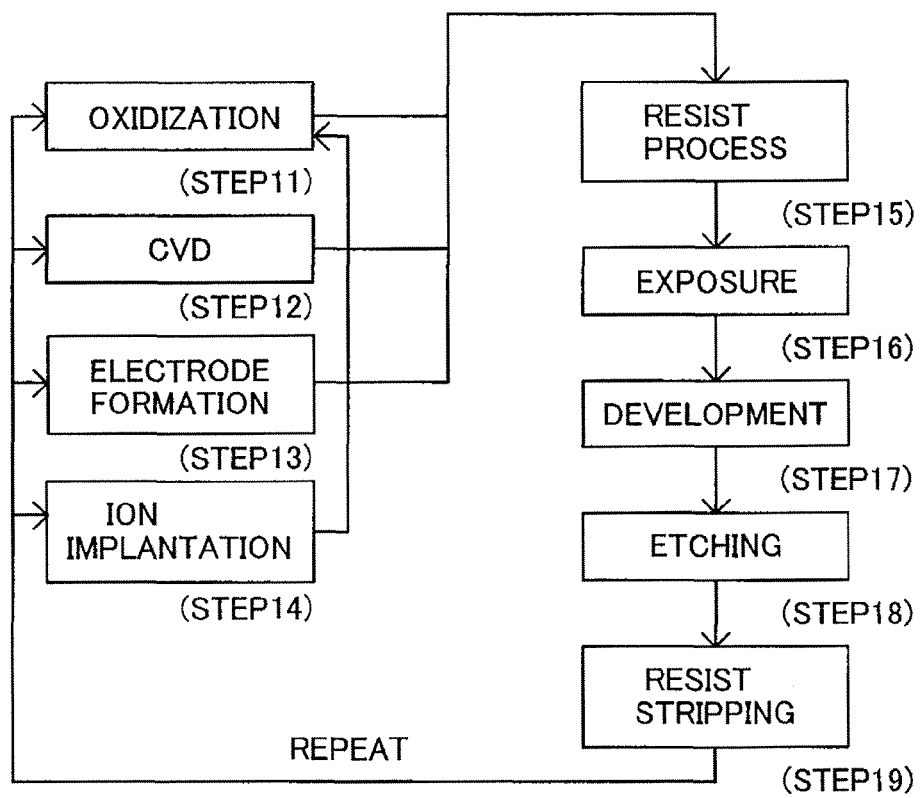
FIG. 11 is a flowchart of details of a wafer process of the step 4 shown in FIG. 10.
Figure 12:
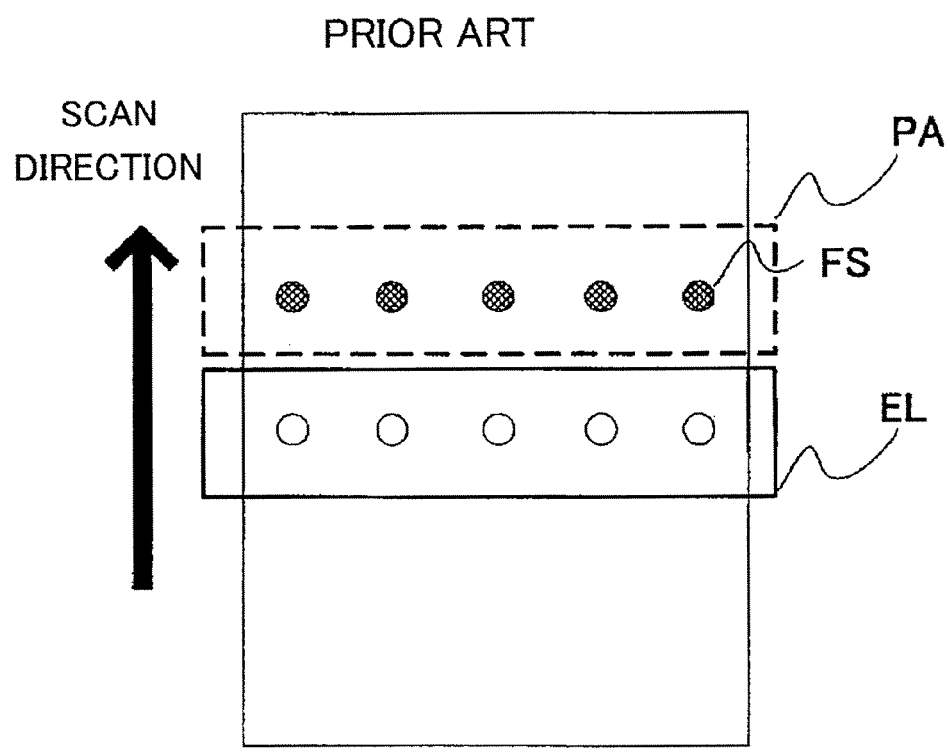
FIG. 12 is a schematic plane view showing a relationship between an exposure position and a focus measurement position on a wafer.
Figures 13A, 13B:
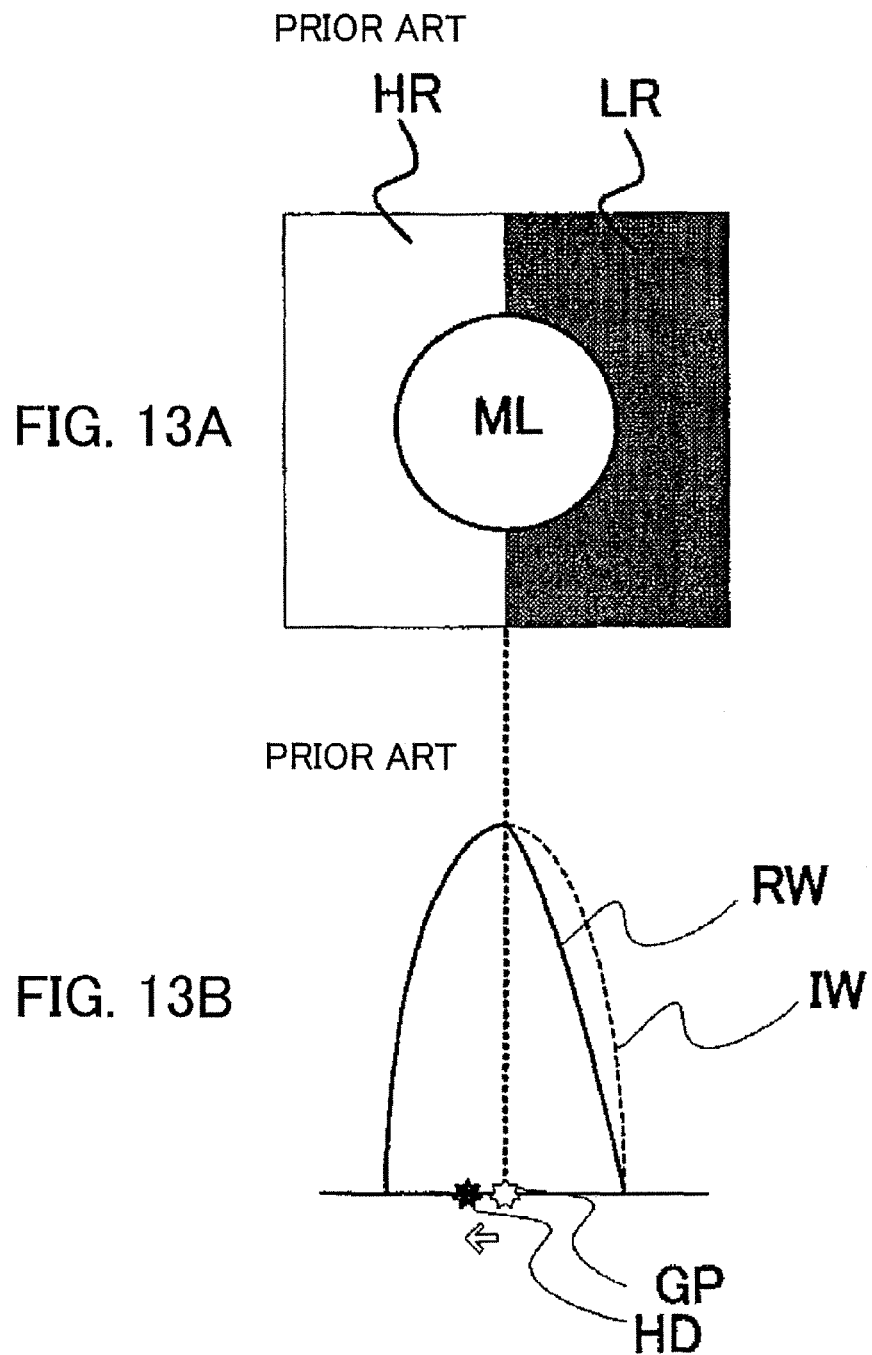
FIG. 13A-13B are views showing an example when the focus measurement result has an error due to a primary coat circuit pattern.
Figure 14:
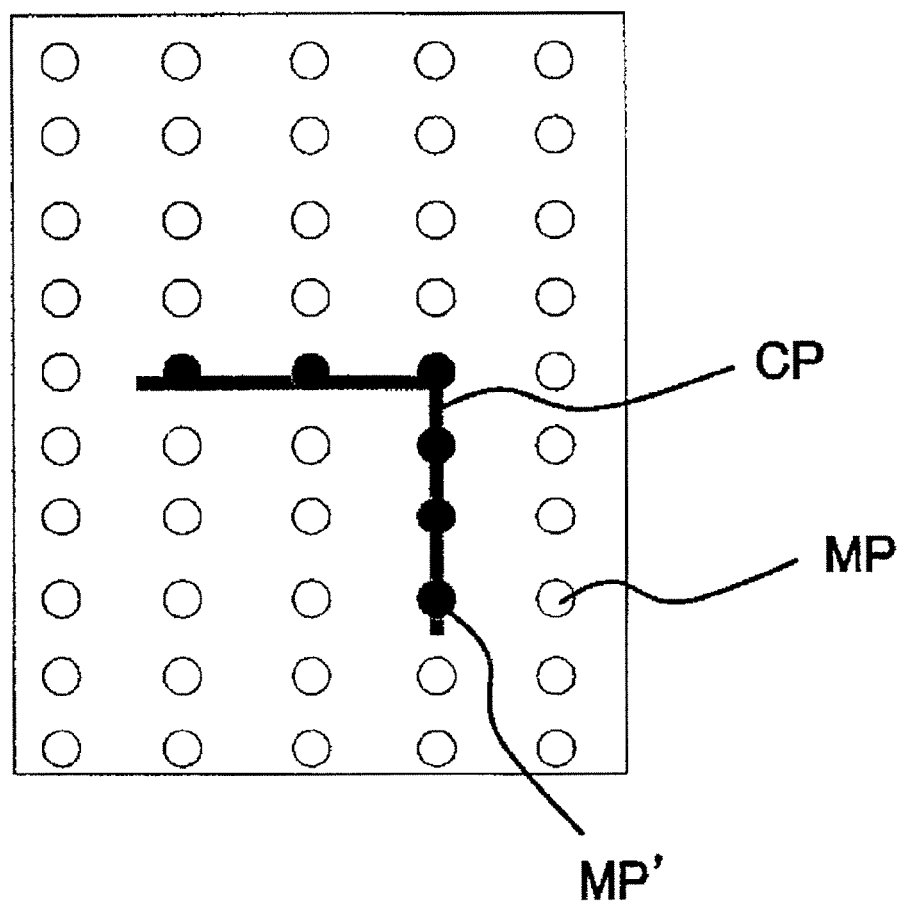
FIG. 14 is a view for explaining a measurement error area in a shot.

Referring now to FIGS. 10 and 11, a description will be given of an embodiment of a device manufacturing method using the above exposure apparatus 1. FIG. 10 is a flowchart for explaining how to fabricate devices, such as a semiconductor device and a LCD device. Here, a description will be given of a fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the above device manufacturing method can provide a higher quality device than ever. The device manufacturing method using the exposure apparatus 1 and a resultant device also constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications Nos. 2006-160622, filed on Jun. 9, 2006 and 2007-142653, filed on May 29, 2007 which is hereby incorporated by reference herein in its entirety.

What is claimed is:

1. An exposure apparatus for focusing a shot of a substrate and exposing the shot to radiation, the apparatus comprising:
a stage configured to hold the substrate and to be moved;
a measurement station including a measurement device configured to perform measurement, with respect to each of a plurality of measurement points in the shot of the substrate held by the stage, of a position of the shot to focus the shot; and
an exposure station configured to expose the shot to radiation while the stage is scanned, the stage being moved to the exposure station from the measurement station after the measurement is performed, and being scanned in the exposure station in accordance with the performed measurement,
wherein the apparatus is configured to obtain an output of the measurement device with respect to each of the plurality of measurement points in each of a plurality of measurement point sets, the plurality of measurement points in the shot, as a measurement point set being in the shot, being shifted to generate the plurality of measurement point sets in the shot, to obtain a status concerning an error of a measurement value of the measurement device with respect to each of the plurality of measurement point sets based on the obtained outputs, and to select one of the plurality of measurement point sets where the measurement device performs the measurement based on the obtained statuses.

2. An apparatus according to claim 1, wherein the apparatus is configured to obtain the status based on an index of the error of the measurement value obtained with respect to each of the plurality of measurement points.

3. An apparatus according to claim 1, wherein the apparatus is configured to determine whether an index of the error of the measurement value obtained with respect to each of the plurality of measurement points falls within a tolerance to obtain the status.

4. An apparatus according to claim 3, wherein the index indicates at least one of a symmetry of a waveform of the output and a deviation of the measurement value.

5. An apparatus according to claim 1, wherein the apparatus is configured to select one of the plurality of measurement point sets, where the measurement device performs the measurement, of which the status.

6. An apparatus according to claim 1, wherein the exposure station includes a projection optical system configured to project light from a reticle to the substrate, and the measurement device is configured to measure the position of the shot in a direction parallel to a direction of an optical axis of the projection optical system.

7. An apparatus according to claim 1, further comprising an input device configured for a user to set a region in which at least one of the plurality of measurement points is to be arranged,
wherein the apparatus is configured to select one of the plurality of measurement point sets, where the measurement device performs the measurement, so that the at least one of the plurality of measurement points is located in the region set via the input device.

8. A method of manufacturing a device, the method comprising steps of:
exposing a substrate to radiation using an exposure apparatus as defined in claim 1;
developing the exposed substrate; and
processing the developed substrate to manufacture the device.

9. An exposure apparatus for focusing a shot of a substrate and exposing the shot to radiation, the apparatus comprising:
a stage configured to hold the substrate and to be moved;
a measurement station including a measurement device configured to perform measurement, with respect to each of a plurality of measurement points in the shot of the substrate held by the stage, of a position of the shot to focus the shot;
an exposure station configured to expose the shot to radiation while the stage is scanned, the stage being moved to the exposure station from the measurement station after the measurement is performed, and being scanned in the exposure station in accordance with the performed measurement; and
an input device configured for a user to input information to set the plurality of measurement points where the measurement device performs the measurement, the plurality of measurement points in the shot, as a measurement point set being in the shot, being shifted to generate another measurement point set being in the shot,
wherein the apparatus is configured to obtain an output of the measurement device with respect to each of the plurality of measurement points of the measurement point set, to obtain a status concerning an error of a measurement value of the measurement device with respect to the measurement point set based on the obtained outputs, to display the obtained status, and to determine whether the other measurement point set is to be generated based on a user's indication input from the input device.

10. An apparatus according to claim 9, wherein the input device is configured for a user to input information of how to shift the plurality of measurement points.

11. An apparatus according to claim 9, wherein the status indicates at least one of a symmetry of a waveform of the output and a deviation of the measurement value.

12. An apparatus according to claim 9, the apparatus is configured to determine whether an index of the error of the measurement value obtained with respect to each of the plurality of measurement points falls within a tolerance to obtain the status.

13. An apparatus according to claim 9,
wherein the apparatus is configured to obtain the status based on an index of the error of the measurement value obtained with respect to each of the plurality of measurement points.

14. A method of manufacturing a device, the method comprising steps of:
exposing a substrate to radiation using an exposure apparatus defined in claim 9;
developing the exposed substrate; and processing the developed substrate to manufacture the device.

15. An exposure apparatus for focusing a shot of a substrate and exposing the shot to radiation, the apparatus comprising: and a stage configured to hold the substrate and to be moved;

a measurement device configured to perform measurement, with respect to each of a plurality of measurement points in the shot of the substrate held by the stage, of a position of the shot to focus the shot;

wherein the apparatus is configured to expose the shot to radiation while the stage is scanned, the stage being scanned in accordance with the performed measurement, to obtain an output of the measurement device with respect to each of the plurality of measurement points in each of a plurality of measurement point sets, the plurality of measurement points in the shot, as a measurement point set being in the shot, being shifted to generate the plurality of measurement point sets in the shot, to obtain a status concerning an error of a measurement value of the measurement device with respect to each of the plurality of measurement point sets based on the obtained outputs, and to select one of the plurality of measurement point sets where the measurement device performs the measurement based on the obtained statuses.

16. A method of manufacturing a device, the method comprising steps of:

exposing a substrate to radiation using an exposure apparatus defined in claim 15;

developing the exposed substrate; and processing the developed substrate to manufacture the device.

17. An exposure apparatus for focusing a shot of a substrate and exposing the shot to radiation, the apparatus comprising:

a stage configured to hold the substrate and to be moved;

a measurement device configured to perform measurement, with respect to each of a plurality of measurement points in the shot of the substrate held by the stage, of a position of the shot to focus the shot; and an input device configured for a user to input information to set the plurality of measurement points where the measurement device performs the measurement, the plurality of measurement points in the shot, as a measurement point set being in the shot, being shifted to generate another measurement point set being in the shot, wherein the apparatus is configured to expose the shot to radiation while the stage is scanned, the stage being scanned in accordance with the performed measurement, to obtain an output of the measurement device with respect to each of the plurality of measurement points of the measurement point set, to obtain a status concerning an error of a measurement value of the measurement device with respect to the measurement point set based on the obtained outputs, to display the obtained status, and to determine whether the other measurement point set is to be generated based on a user's indication input from the input device.

18. A method of manufacturing a device, the method comprising steps of:

exposing a substrate to radiation using an exposure apparatus defined in claim 17;

developing the exposed substrate; and processing the developed substrate to manufacture the device.

* * * * *